(12) United States Patent
Asai

(10) Patent No.: US 11,398,400 B2
(45) Date of Patent: Jul. 26, 2022

(54) PROCESSING APPARATUS

(71) Applicant: DISCO CORPORATION, Tokyo (JP)

(72) Inventor: Kohei Asai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/344,007

(22) Filed: Jun. 10, 2021

(65) Prior Publication Data

US 2022/0005725 A1    Jan. 6, 2022

(30) Foreign Application Priority Data

Jul. 2, 2020 (JP) .............................. JP2020-114973

(51) Int. Cl.
     *B32B 43/00*      (2006.01)
     *H01L 21/683*      (2006.01)
     *B32B 38/10*      (2006.01)

(52) U.S. Cl.
     CPC ...... *H01L 21/6838* (2013.01); *H01L 21/6836* (2013.01); *B32B 38/10* (2013.01); *B32B 43/006* (2013.01); *Y10T 156/1132* (2015.01); *Y10T 156/1944* (2015.01)

(58) Field of Classification Search
     CPC . B32B 38/10; B32B 43/006; Y10T 156/1132; Y10T 156/1944
     See application file for complete search history.

(56) References Cited

U.S. PATENT DOCUMENTS

| | | | |
|---|---|---|---|
| 7,406,759 B2* | 8/2008 | Yamamoto | H01L 21/6838 29/559 |
| 7,845,539 B1* | 12/2010 | Kim | B23K 3/0623 228/39 |
| 8,500,182 B2* | 8/2013 | Yang | H01L 21/6838 294/188 |
| 9,227,261 B2* | 1/2016 | Khanna | B23K 37/0408 |
| 2002/0034928 A1* | 3/2002 | Doan | B24D 9/085 451/285 |
| 2012/0090763 A1* | 4/2012 | Okuno | H01L 21/6838 156/64 |
| 2014/0189998 A1* | 7/2014 | Kusunose | H01L 21/6838 29/559 |
| 2014/0302755 A1* | 10/2014 | Kumamoto | B25B 11/005 451/388 |
| 2015/0118799 A1* | 4/2015 | Khanna | B23K 1/0016 438/125 |
| 2018/0339497 A1* | 11/2018 | Makino | B32B 27/08 |

FOREIGN PATENT DOCUMENTS

JP      2005153090 A    6/2005

* cited by examiner

*Primary Examiner* — Philip C Tucker
*Assistant Examiner* — Nickolas R Harm
(74) *Attorney, Agent, or Firm* — Greer Burns & Crain Ltd.

(57) ABSTRACT

A processing apparatus includes a chuck table mechanism including a chuck table configured to hold the wafer and a table base configured to support the chuck table in a detachable manner. The chuck table includes a porous plate having a suction surface that sucks the wafer, a frame body surrounding surfaces of the porous plate other than the suction surface of the porous plate, a wafer suction hole formed in the frame body and configured to transmit a suction force to the suction surface of the porous plate, and a bolt hole formed in the frame body and configured to fix the frame body to the table base.

8 Claims, 5 Drawing Sheets

PROCESSING APPARATUS

BACKGROUND OF THE INVENTION

Field of the Invention

The present invention relates to a processing apparatus including a holding unit that sucks and holds a wafer, a processing unit having, in a rotatable manner, a grinding wheel that grinds the wafer held by the holding unit, and a processing liquid supply unit that supplies a processing liquid to the wafer.

Description of the Related Art

A wafer having a plurality of devices such as integrated circuits (ICs) or large-scale integrated circuits (LSIs) formed on the top surface of the wafer, the plurality of devices being demarcated by a plurality of planned dividing lines intersecting each other, is processed into a desired thickness by grinding of the undersurface of the wafer. The wafer is thereafter divided into individual device chips by a dicing apparatus or a laser processing apparatus. The divided device chips are used in electric apparatuses such as mobile telephones or personal computers.

A grinding apparatus includes a holding unit that sucks and holds the wafer; a processing unit having, in a rotatable manner, a grinding wheel that grinds the wafer held by the holding unit; and a processing liquid supply unit that supplies grinding water as a processing liquid to the wafer. The grinding apparatus can process the wafer into a desired thickness (see Japanese Patent Laid-Open No. 2005-153090, for example).

In addition, the processing apparatus disclosed in Japanese Patent Laid-Open No. 2005-153090 can supply free abrasive grains as a processing liquid to the undersurface of the wafer, and process the undersurface of the wafer into a mirror surface by a polishing pad. The holding unit that sucks and holds the wafer includes a chuck table that holds the wafer and a table base that supports the chuck table in a detachable manner. The chuck table includes a porous plate having a suction surface that sucks the wafer; a frame body that surrounds surfaces of the porous plate other than the suction surface of the porous plate; a wafer suction hole that is formed in a bottom surface of the frame body and transmits a suction force to the suction surface of the porous plate; and bolt holes for fixation to the table base, the bolt holes being formed in the frame body. The chuck table is thus configured to be able to surely suck and hold the wafer.

SUMMARY OF THE INVENTION

In a case where the wafer is ground in the grinding apparatus, the holding surface of the chuck table is ground by a grinding unit of the grinding apparatus in advance, thereby making the shape of the holding surface of the chuck table and the shape of the ground surface of the wafer mounted and held on the chuck table identical to each other. The thickness of the wafer is thus uniformized over an entire area of the wafer.

However, it has been clarified that, even when the wafer is actually ground by the above-described processing method, there are minute thickness variations (for example, approximately 2 to 3 µm) when the thickness of the wafer after being processed is measured. Though such minute thickness variations do not present a great problem in a case where a thickness target value of the wafer is large (thick), such minute thickness variations can be a great problem in a case where the target thickness of the wafer has become very small as in recent years.

As a result of diligently investigating the above-described problems, the present applicant has identified that, in the conventional grinding apparatus, the form of the frame body constituting the chuck table is not uniform between a case where the holding surface of the chuck table is ground and a case where the wafer is sucked and held on the holding surface of the chuck table and is ground, finding this to be a cause of occurrence of the variations in the thickness of the wafer.

It is accordingly an object of the present invention to provide a processing apparatus that can solve the problem in which the form of the frame body constituting the chuck table is not uniform between a case where the holding surface of the chuck table is ground and a case where the wafer is sucked and held on the holding surface of the chuck table and is ground.

In accordance with an aspect of the present invention, there is provided a processing apparatus including a chuck table mechanism configured to suck and hold a wafer; a processing unit having, in a rotatable manner, a grinding wheel that grinds the wafer held by the chuck table mechanism; and a processing liquid supply unit configured to supply a processing liquid to the wafer; the chuck table mechanism including a chuck table configured to hold the wafer and a table base configured to support the chuck table in a detachable manner, the chuck table including a porous plate having a suction surface that sucks the wafer, a frame body surrounding a surface of the porous plate other than the suction surface of the porous plate, a wafer suction hole formed in the frame body and configured to transmit a suction force to the suction surface of the porous plate, and a bolt hole formed in the frame body and configured to fix the frame body to the table base, the table base including a mounting surface configured to be mounted with a surface of the frame body on a side opposite from a surface of the frame body on which surface the porous plate is mounted, and a frame body suction hole formed in the mounting surface and configured to suck and attract the frame body.

Preferably, the wafer suction hole is formed so as to open in the surface of the frame body on the side opposite from the surface of the frame body on which surface the porous plate is mounted, and a communicating hole that communicates with the wafer suction hole and that is independent of the frame body suction hole is formed in the mounting surface of the table base. Alternatively, the wafer suction hole is formed so as to open in a side surface of the frame body, and a communicating hole made to communicate with the wafer suction hole is formed in a side surface of the table base.

According to the present invention, both at a time of grinding the suction surface of the porous plate of the chuck table and at a time of grinding the wafer, grinding is performed by the grinding wheel of the processing unit in a state in which the entire area of the frame body of the chuck table is securely fixed to the table base. Thus, the shape of the holding surface of the chuck table, that is, the suction surface of the porous plate, and the shape of the ground surface of the wafer coincide with each other, so that the occurrence of variations in thickness of the wafer which variations occur after the grinding is reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
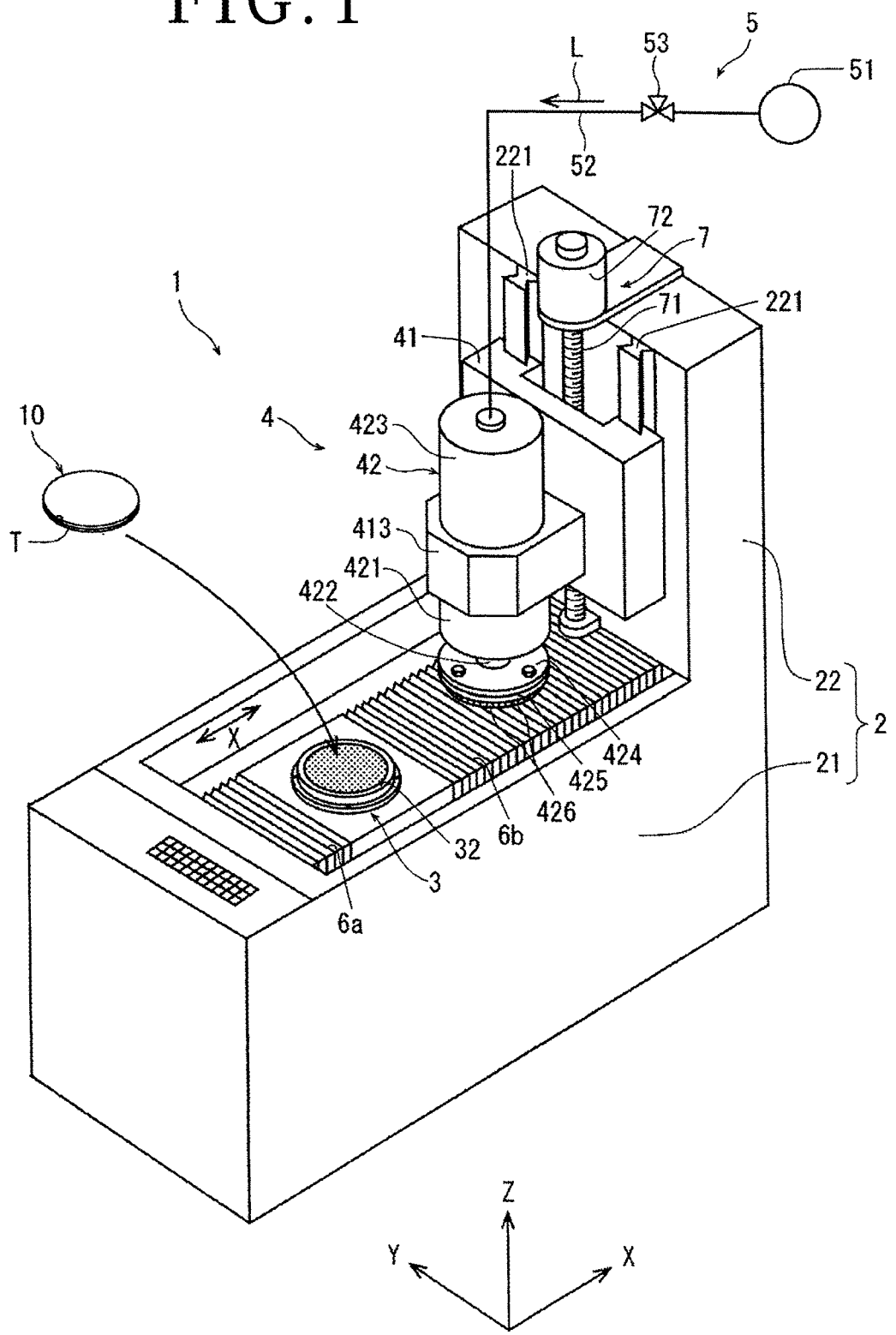
FIG. 1 is a general perspective view of a grinding apparatus according to a present embodiment.

A processing apparatus according to an embodiment of the present invention will hereinafter be described in detail with reference to the accompanying drawings. FIG. 1 illustrates a general perspective view of a grinding apparatus 1 as a processing apparatus according to the present embodiment. The grinding apparatus 1 illustrated in FIG. 1 includes a chuck table mechanism 3 as a holding unit that sucks and holds a plate-shaped semiconductor wafer (hereinafter simply abbreviated to a wafer) 10 as a workpiece in the present embodiment; a grinding unit 4 as a processing unit that grinds the wafer 10 held by the chuck table mechanism 3; and a processing liquid supply unit 5 that supplies a processing liquid to the wafer 10.

The grinding apparatus 1 has an apparatus housing 2. The apparatus housing 2 includes a main body portion 21 in a substantially rectangular parallelepipedic shape and an upright wall 22 provided on a rear end portion of the main body portion 21 and erected in an upward-downward direction.

The chuck table mechanism 3 is arranged in the main body portion 21 and has bellows 6a and 6b connected on both sides of the chuck table mechanism 3 in an X-axis direction indicated by an arrow X. Housed within the main body portion 21 is a moving mechanism (not illustrated) that moves the chuck table mechanism 3 in the direction indicated by the arrow X in the figure. Actuation of the moving mechanism can expand or contract the bellows 6a and 6b, and move the chuck table mechanism 3 between a loading and unloading region on a near side in the figure in which region an unprocessed wafer 10 is mounted onto a chuck table 32 and a processing region on a far side in the figure in which region processing is performed directly under the grinding unit 4.

Figure 2:
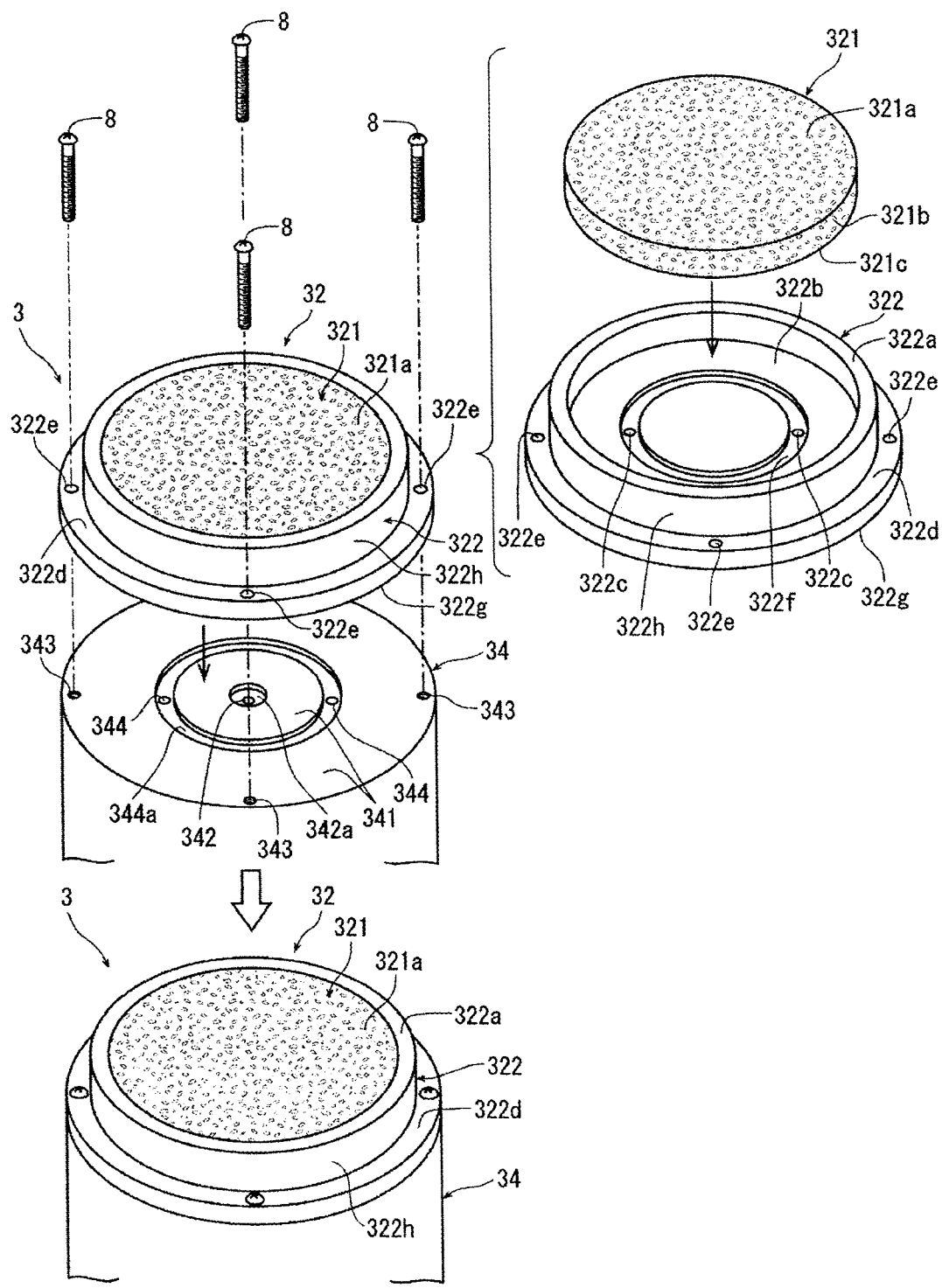
FIG. 2 is a perspective view and an exploded perspective view of a chuck table mechanism of the grinding apparatus illustrated in FIG. 1.

The chuck table mechanism 3 according to the present embodiment will be described more specifically with reference to FIG. 2. The chuck table mechanism 3 includes at least the chuck table 32 and a table base 34 that supports the chuck table 32 in a detachable manner. As illustrated on a right side in the figure, the chuck table 32 includes a porous plate 321 having a suction surface 321a that sucks the wafer 10; and a frame body 322 that surrounds surfaces of the porous plate 321 other than the suction surface 321a of the porous plate 321, that is, a side surface 321b and an undersurface 321c on a side opposite from the suction surface 321a. The frame body 322 includes a side wall 322h that has a frame upper surface 322a and forms a side surface; a plate mounting surface 322b on which the undersurface 321c of the porous plate 321 is mounted; a plurality of wafer suction holes 322c that are formed so as to open in a bottom surface 322g on a side opposite from the plate mounting surface 322b and transmit a suction force (negative pressure) to the suction surface 321a of the porous plate 321; an outer circumferential stepped portion 322d formed along the side wall 322h; and a plurality of bolt holes 322e that are formed in the outer circumferential stepped portion 322d and are used to fix the frame body 322 to the table base 34. The plurality of wafer suction holes 322c opening in the plate mounting surface 322b are coupled to each other by an annular groove 322f. The bolt holes 322e in the present embodiment are four bolt holes (only three bolt holes are illustrated in FIG. 2) formed at equal intervals in the outer circumferential stepped portion 322d. The porous plate 321 according to the present embodiment is, for example, formed of porous ceramic having air permeability. However, the porous plate 321 can also be molded from another material that can be ground and has air permeability, for example, a pumice stone or an aggregated material of a granular object made of resin or made of metal. The porous plate 321 is thus not particularly limited to any specific kind.

As illustrated on the left side of FIG. 2, the table base 34 includes at least a mounting surface 341 on which the bottom surface 322g of the frame body 322 is mounted, which bottom surface is on a side opposite from the surface of the frame body 322 on which surface the porous plate 321 is mounted; and a frame body suction hole 342 that is formed in the mounting surface 341 and through which the bottom surface 322g of the frame body 322 is sucked and attracted by actuation of a suction source not illustrated. The frame body suction hole 342 in the present embodiment is formed in a central region of the mounting surface 341 of the table base 34. In an outer circumferential edge portion of the mounting surface 341 of the table base 34, bolt fastening holes 343 having female threads formed therein are formed at positions corresponding to the bolt holes 322e formed in the frame body 322 of the above-described chuck table 32. An enlarged diameter portion 342a having a larger diameter than the frame body suction hole 342 is formed on the mounting surface 341 side of the frame body suction hole 342.

Further, formed in the mounting surface 341 of the table base 34 are a plurality of first communicating holes 344 that communicate with the wafer suction holes 322c formed in the frame body 322 of the above-described chuck table 32 and that are connected to an unillustrated suction source by a path independent of the above-described frame body suction hole 342. In addition, an annular groove 344a that makes the plurality of first communicating holes 344 communicate with each other is formed in the mounting surface 341 of the table base 34 in the present embodiment.

The chuck table 32 and the table base 34 are made integral with each other by fastening bolts 8 being inserted through the bolt holes 322e formed in the frame body 322 of the chuck table 32 and being fastened to the bolt fastening holes 343 of the table base 34.

Figure 3:
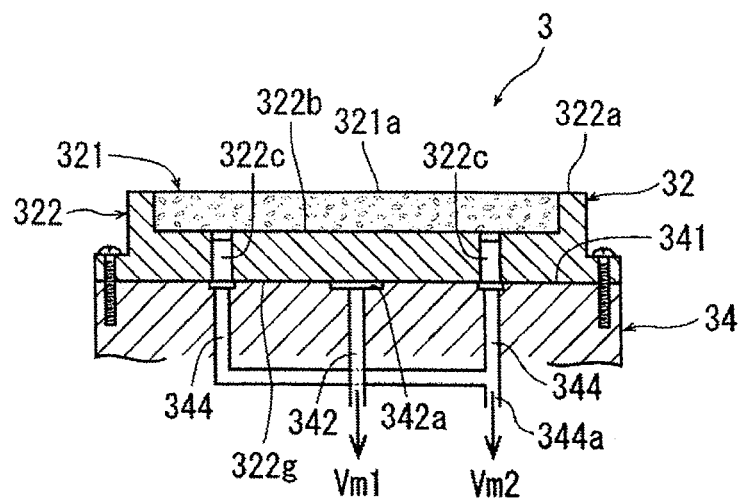
FIG. 3 is a partial schematic sectional view of the chuck table mechanism illustrated in FIG. 2.

FIG. 3 illustrates a partial schematic sectional view of the chuck table mechanism 3 in which the chuck table 32 and the table base 34 are integral with each other. As illustrated in the figure, the table base 34 has the frame body suction hole 342 formed in the mounting surface 341 on which the frame body 322 is mounted, and a first suction force (negative pressure) Vm1 can be made to act on the bottom surface 322g of the frame body 322 of the chuck table mechanism 3 by actuation of a suction source not illustrated, so that the frame body 322 can be sucked and attracted. In addition, if a wafer 10 is mounted on the suction surface 321a of the porous plate 321 and is to be sucked and held on the suction surface 321a, a second suction force (negative pressure) Vm2 can be transmitted to the suction surface 321a of the porous plate 321 via the first communicating holes 344 formed in the table base 34 and the wafer suction holes 322c in the frame body 322. The wafer 10 can thereby be sucked and held. The frame body suction hole 342 and the first communicating holes 344 are connected to unillustrated suction sources by suction paths independent of each other. Thus, even when the wafer 10 is not sucked and held on the chuck table 32, only the frame body 322 can be attracted to the table base 34 and sucked and held on the table base 34.

Continuing the description by returning to FIG. 1, the grinding unit 4 is disposed on the front surface of the upright wall 22. The grinding unit 4 includes a moving base 41 and a spindle unit 42 fitted to the moving base 41. The moving base 41 engages, on a rear surface side, with a pair of guide rails 221 arranged on the upright wall 22 of the apparatus housing 2, and is fitted to the guide rails 221 so as to be slidable in a Z-axis direction (upward-downward direction).

The spindle unit 42 includes a spindle housing 421 supported by a supporting portion 413 formed integrally with the moving base 41; a spindle 422 rotatably retained in the spindle housing 421; and a servomotor 423 disposed as a rotation driving unit for rotationally driving the spindle 422. A lower end portion of the spindle 422 projects on a lower end side of the spindle housing 421. A mounter 424 is provided to a lower end of the spindle 422. A grinding wheel 425 is fitted to a lower surface of the mounter 424. A plurality of grinding stones 426 are annularly arranged on a lower surface of the grinding wheel 425.

The grinding apparatus 1 illustrated in FIG. 1 has a grinding feed mechanism 7 that moves the above-described grinding unit 4 in the upward-downward direction (direction perpendicular to a holding surface of the chuck table which holding surface will be described later) along the above-described pair of guide rails 221. The grinding feed mechanism 7 includes a male screw rod 71 that is disposed on the front surface side of the upright wall 22 and that extends in the upward-downward direction. An upper end portion and a lower end portion of the male screw rod 71 are rotatably supported by the upright wall 22. A pulse motor 72 as a driving source for rotationally driving the male screw rod 71 is disposed on the upper side end portion of the male screw rod 71. An output shaft of the pulse motor 72 is coupled to the male screw rod 71. A screw coupling portion (not illustrated) is formed on a rear surface of the moving base 41. A female screw hole extending in the upward-downward direction is formed in the coupling portion. The above-described male screw rod 71 is screwed into the female screw hole. The grinding feed mechanism 7 formed by such a screw mechanism can lower the grinding unit 4 together with the moving base 41 by normal rotation of the pulse motor 72, and raise the grinding unit 4 together with the moving base 41 by reverse rotation of the pulse motor 72.

The grinding apparatus 1 is provided with the processing liquid supply unit 5 that supplies a processing liquid L such as grinding water to a workpiece ground on the chuck table mechanism 3. The processing liquid supply unit 5 includes a processing liquid tank 51 that retains the processing liquid L and has a pumping pump; a processing liquid supply passage 52 that connects the processing liquid tank 51 and the grinding unit 4 to each other; and an opening and closing valve 53 that is disposed on the processing liquid supply passage 52 and opens and closes the processing liquid supply passage 52. The processing liquid L can be supplied to the processing region via the grinding unit 4 by actuation of the pumping pump of the processing liquid tank 51 and opening of the opening and closing valve 53.

Figure 4:
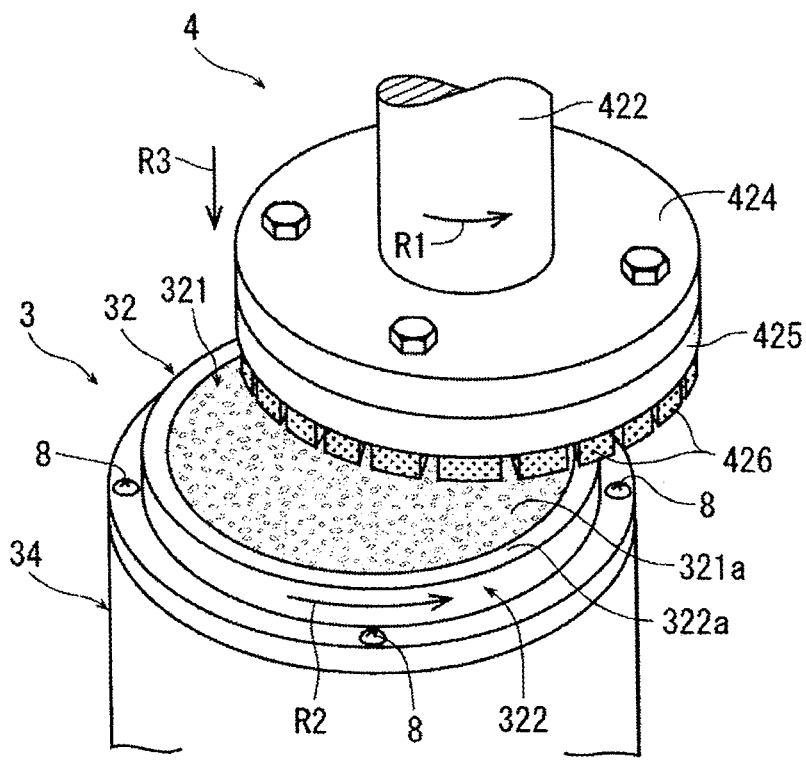
FIG. 4 is a perspective view illustrating a mode in which the grinding apparatus illustrated in FIG. 1 grinds the holding surface of a chuck table.

The grinding apparatus 1 according to the present embodiment substantially has the configuration as described above. Functions and actions of the grinding apparatus 1 according to the present embodiment will be described below. As described above, at a time of grinding a wafer 10 in the grinding apparatus 1, the holding surface of the chuck table 32, that is, the suction surface 321a of the porous plate 321, is ground by the grinding unit 4, as illustrated in FIG. 4. At a time of performing the grinding, first, as described on the basis of FIG. 3, the first suction force (negative pressure) Vm1 is made to act on the bottom surface 322g of the frame body 322 constituting the chuck table mechanism 3, by actuation of a suction source not illustrated. The frame body 322 is thereby sucked and attracted. At this time, the wafer 10 is not mounted on the holding surface of the chuck table 32. Thus, it is not necessary to transmit the second suction force (negative pressure) Vm2 via the first communicating holes 344 formed in the table base 34 and the wafer suction holes 322c in the frame body 322.

Next, the chuck table 32 is positioned in the processing region under the grinding unit 4, that is, in a position in which the grinding stones 426 of the grinding unit 4 pass the rotational center of the chuck table 32, by actuation of a moving mechanism not illustrated. Then, the spindle 422 of the grinding unit 4 is rotated in a direction indicated by an arrow R1 at a predetermined rotational speed (for example, 4000 rpm), and the chuck table 32 is rotated in a direction indicated by an arrow R2 at a predetermined rotational speed (for example, 300 rpm) by actuation of a rotation driving unit not illustrated. Subsequently, the grinding unit 4 is lowered in a direction indicated by an arrow R3 by actuation of the above-described grinding feed mechanism 7. The grinding stones 426 arranged on the lower surface of the grinding wheel 425 are made to abut against the porous plate 321 of the chuck table 32 while the processing liquid L (grinding water) is supplied to the holding surface of the chuck table 32. The suction surface 321a of the porous plate 321 is ground for a certain period of time at a predetermined lowering speed (for example, 0.1 μm/sec). The grinding feed mechanism 7 is then stopped. Thereafter, the holding surface of the chuck table 32 is formed into a flat surface by performance of idle operation for a predetermined period of time. The grinding processing is thereby completed. Incidentally, it is preferable to supply the processing liquid L to the holding surface of the chuck table 32 by using the above-described processing liquid supply unit 5, and to also jet the processing liquid L from the suction surface 321a of the porous plate 321 by using the wafer suction holes 322c.

As described above, the frame body 322 of the chuck table 32 is fixed by the plurality of bolts 8, and is sucked and attracted through the frame body suction hole 342. The entire area of the frame body 322 is thus securely fixed on the mounting surface 341 of the table base 34. In this state, the suction surface 321a of the porous plate 321 which suction surface constitutes the holding surface of the chuck table 32 is ground.

Figure 5:
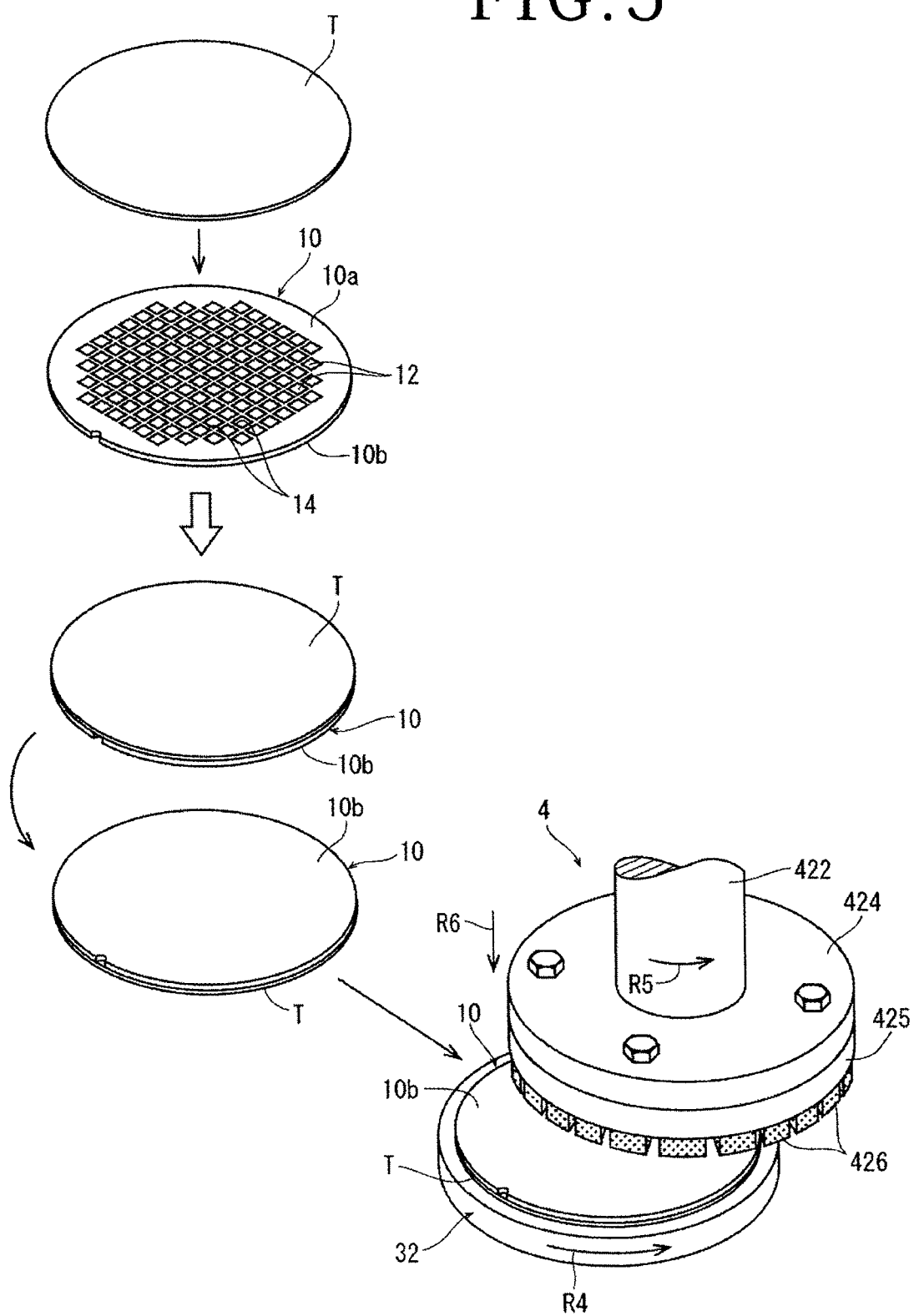
FIG. 5 is a perspective view illustrating a mode in which the grinding apparatus illustrated in FIG. 1 grinds a wafer.

As described above, after the holding surface of the chuck table 32 is ground, grinding processing on the wafer 10 as a workpiece according to the present embodiment is performed, as illustrated in FIG. 5. The wafer 10 has a plurality of devices 12 formed on a top surface 10a thereof, the plurality of devices 12 being demarcated by a plurality of planned dividing lines 14 intersecting each other. A protective tape T is affixed to the top surface 10a of the wafer 10, and is thereby made integral with the wafer 10. The wafer 10 is inverted, and is mounted on the holding surface of the chuck table 32 moved to the loading and unloading region with an undersurface 10b side directed upward and with the protective tape T directed downward.

At a time of performing grinding processing on the undersurface 10b of the wafer 10, first, as described on the basis of FIG. 3, the first suction force (negative pressure) Vm1 is made to act on the bottom surface 322g of the frame body 322 constituting the chuck table mechanism 3, by actuation of a suction source not illustrated. The frame body 322 is thereby sucked and attracted. Further, the second suction force (negative pressure) Vm2 is transmitted to the suction surface 321a of the porous plate 321 via the first communicating holes 344 formed in the table base 34 and the wafer suction holes 322c in the frame body 322. The wafer 10 is thereby sucked and held on the holding surface of the chuck table 32.

Next, the chuck table 32 is positioned in the processing region under the grinding unit 4, that is, in a position in which the grinding stones 426 of the grinding unit 4 pass the rotational center of the chuck table 32, by actuation of a moving mechanism not illustrated. Then, the chuck table 32 is rotated in a direction indicated by an arrow R4 at a predetermined rotational speed (for example, 300 rpm) by actuation of a rotation driving unit not illustrated, and the spindle 422 of the grinding unit 4 is rotated in a direction indicated by an arrow R5 at a predetermined rotational speed (for example, 4000 rpm). Subsequently, the processing liquid L (grinding water) is supplied while the processing liquid supply unit 5 is actuated. The grinding unit 4 is lowered in a direction indicated by an arrow R6 at a predetermined lowering speed (for example, 0.1 µm/sec) by actuation of the grinding feed mechanism 7 described above. The grinding stones 426 are thereby made to abut against the undersurface 10b of the wafer 10. When the wafer 10 is ground to a desired thickness while the thickness of the wafer 10 is detected by thickness detecting means not illustrated, the grinding feed mechanism 7 is stopped, and thereafter the undersurface 10b of the wafer 10 is formed into a flat surface by performance of idle operation for a predetermined period of time as in the case of grinding the holding surface of the chuck table 32. The grinding processing is thereby completed.

According to the foregoing embodiment, both at the time of grinding the suction surface 321a of the porous plate 321 of the chuck table 32 and at the time of grinding the wafer 10, grinding is performed by the grinding wheel 425 of the grinding unit 4 in a state in which the entire area of the frame body 322 of the chuck table 32 is securely fixed to the table base 34. Thus, the shape of the holding surface of the chuck table 32, that is, the suction surface 321a of the porous plate 321, and the shape of the ground surface of the wafer 10 coincide with each other, so that the occurrence of variations in thickness of the wafer 10 which variations occur after the grinding is reduced.

In addition, in the foregoing embodiment, the wafer suction holes 322c that transmit a suction force to the suction surface 321a of the porous plate 321 which suction surface constitutes the holding surface of the chuck table 32 are independent of the frame body suction hole 342 that attracts, by suction, the frame body 322 of the chuck table 32 to the mounting surface 341 of the table base 34. This avoids entry of the processing liquid L in which grinding swarf sucked from the porous plate 321 of the chuck table 32 is mixed between the mounting surface 341 of the table base 34 and the frame body 322, and also reduces variations in thickness of the wafer 10 which variations are caused by the grinding swarf.

Further, when the wafer 10 is separated and unloaded from the chuck table 32 by supplying and jetting of a mixed fluid of air and water to the porous plate 321 with use of the wafer suction holes 322c after the undersurface 10b of the wafer 10 is ground, the processing liquid L in which grinding swarf entering the wafer suction holes 322c is mixed is also jetted. However, because the wafer suction holes 322c and the frame body suction hole 342 are independent of each other, entry of the processing liquid L in which the grinding swarf is mixed between the mounting surface 341 of the table base 34 and the frame body 322 is avoided, and as above, variations in thickness of the wafer 10 which variations are caused by the grinding swarf are also reduced.

It is to be noted that the present invention is not limited to the foregoing embodiment, and that various modifications are provided. For example, the above-described chuck table mechanism 3 illustrated as the holding unit according to the present invention may be another embodiment as described in the following.

Another chuck table mechanism 3' configured on the basis of the present invention will be described with reference to FIG. 6A and FIG. 6B. Incidentally, the same configurations as in the chuck table mechanism 3 described earlier are identified by the same numbers, and description of the same configurations will be omitted as appropriate.

The chuck table mechanism 3' includes at least a chuck table 32' and a table base 34' that supports the chuck table 32' in a detachable manner. As illustrated on a right side in the figure, the chuck table 32' includes a porous plate 321 having a suction surface 321a that sucks a wafer 10; and a frame body 322' that surrounds surfaces of the porous plate 321 other than the suction surface 321a of the porous plate 321, that is, a side surface 321b and an undersurface 321c on a side opposite from the suction surface 321a. The frame body 322' includes a side wall 322h' that has a frame upper surface 322a' and forms a side surface; a plurality of wafer suction holes 322c' that are formed so as to open in the side wall 322h' and transmit a suction force (negative pressure) to the suction surface 321a of the porous plate 321; an outer circumferential stepped portion 322d' formed along the side wall 322h'; and a plurality of bolt holes 322e' that are formed in the outer circumferential stepped portion 322d' and are used to fix the frame body 322' to the table base 34'. In the frame body 322', two linear grooves 322f' that couple the four suction holes 322c' formed in the side wall 322h' of the frame body 322' to one another and that are orthogonal to each other are formed in a plate mounting surface 322b' on which the undersurface 321c of the porous plate 321 is mounted.

Figures 6A, 6B:
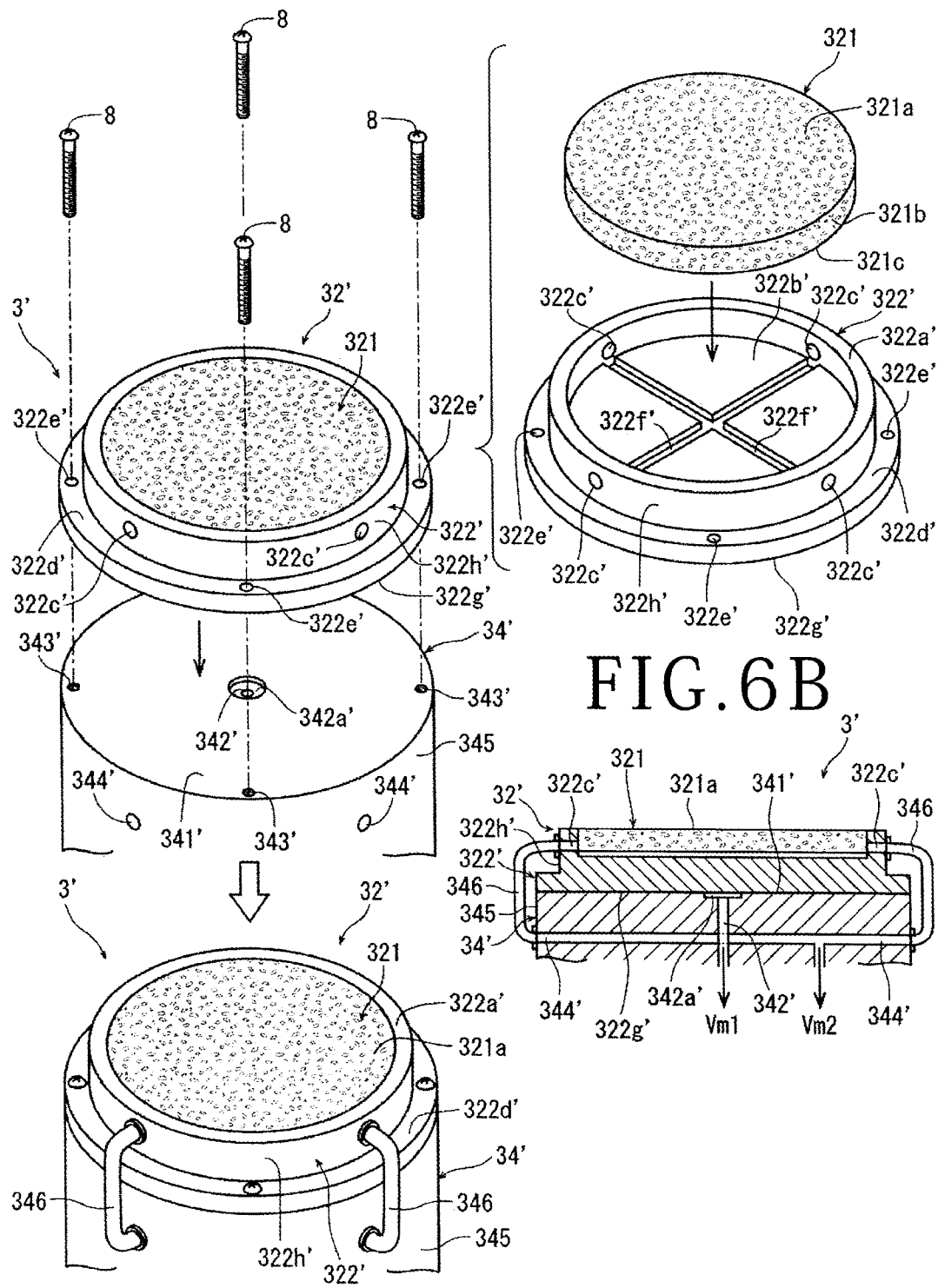
FIG. 6A is an exploded perspective view and a perspective view illustrating another embodiment of the chuck table mechanism.
FIG. 6B is a partial schematic sectional view of the chuck table mechanism illustrated in FIG. 6A.

As illustrated on the left side of FIG. 6A, the table base 34' includes at least a mounting surface 341' on which a bottom surface 322g' of the frame body 322' is mounted, which bottom surface is on a side opposite from the plate mounting surface 322b' of the frame body 322' on which surface the porous plate 321 is mounted; and a frame body suction hole 342' that is formed in the mounting surface 341' and through which the bottom surface 322g' of the frame body 322' is sucked and attracted by actuation of a suction source not illustrated. The frame body suction hole 342' in the present embodiment is formed in a central region of the mounting surface 341' of the table base 34'. In an outer circumferential edge portion of the mounting surface 341', bolt fastening holes 343' are formed at positions corresponding to the bolt holes 322e' formed in the frame body 322' of the above-described chuck table 32'. An enlarged diameter portion 342a' having a larger diameter than the frame body suction hole 342' is formed on the mounting surface 341' side of the frame body suction hole 342'.

Further, as is understood by referring also to a partial schematic sectional view of the chuck table mechanism 3' illustrated in FIG. 6B, second communicating holes 344' are formed in a side surface 345 of the table base 34', the second communicating holes 344' being made to communicate with the wafer suction holes 322c' formed in the frame body 322' of the chuck table 32' described above, and being connected to an unillustrated suction source by a path independent of the frame body suction hole 342' described above.

The chuck table 32' and the table base 34' are made integral with each other by fastening bolts 8 being inserted through the bolt holes 322e' formed in the frame body 322' of the chuck table 32' and being fastened to the bolt fastening holes 343' of the table base 34'. Further, the wafer suction holes 322c' and the second communicating holes 344' are made to communicate with each other by a communicating passage 346.

According to the chuck table mechanism 3' illustrated in FIG. 6A and FIG. 6B, the table base 34' has the frame body suction hole 342' formed so as to open in the mounting surface 341' on which the bottom surface 322g' of the frame body 322' is mounted, and the first suction force (negative pressure) Vm1 is made to act on the bottom surface 322g' of the frame body 322' by actuation of a suction source not illustrated. The frame body 322' can thereby be sucked and attracted. In addition, when a wafer 10 is mounted on the suction surface 321a of the porous plate 321 and is to be sucked and held on the suction surface 321a, the second suction force (negative pressure) Vm2 can be transmitted to the suction surface 321a of the porous plate 321 via the second communicating holes 344' formed in the table base 34', the communicating passage 346, and the wafer suction holes 322c'. The wafer 10 can thereby be sucked and held.

In the embodiment illustrated in FIG. 6A and FIG. 6B, the frame body suction hole 342' and the second communicating holes 344' are connected to suction sources by suction paths independent of each other, and actions and effects similar to those of the foregoing embodiment described on the basis of FIG. 2 can be produced. Further, according to this embodiment, the suction force Vm2 transmitted to the suction surface 321a of the porous plate 321 held in the frame body 322' is supplied by the wafer suction holes 322c' formed in the side wall 322h' of the frame body 322', the communicating passage 346, and the second communicating holes 344' without passing through the mounting surface 341' of the table base 34'. This further avoids the problem of entry of the processing liquid L in which grinding swarf is mixed between the mounting surface 341' of the table base 34' and the frame body 322', and further reduces variations in thickness of the wafer 10 which variations are caused by the grinding swarf.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
a chuck table mechanism configured to suck and hold a wafer;
a processing unit having, in a rotatable manner, a grinding wheel that grinds the wafer held by the chuck table mechanism; and
a processing liquid supply unit configured to supply a processing liquid to the wafer;
the chuck table mechanism including
a chuck table configured to hold the wafer, and
a table base configured to support the chuck table in a detachable manner;
the chuck table including
a porous plate having a suction surface configured to suck the wafer,
a frame body having a plate mounting surface configured to support the porous plate and being configured to surround the porous plate other than the suction surface of the porous plate,
a wafer suction hole formed in the frame body and configured to transmit a suction force to the suction surface of the porous plate, and
a fixing hole formed in the frame body and configured to fix the frame body to the table base;
the table base including
a mounting surface configured to be mounted with a bottom surface of the frame body opposite the plate mounting surface on which the porous plate is configured to be mounted,
a receiving hole formed on the mounting surface and configured to cooperatively receive a fastener inserted through the fixing hole in the frame body to fasten the frame body to the mounting surface, and
a frame body suction hole formed in the mounting surface and configured to apply a suction force on the bottom surface of the frame body.

2. The processing apparatus according to claim 1, wherein the wafer suction hole is formed so as to open in the bottom surface of the frame body on the side opposite from the plate mounting surface of the frame body on which surface the porous plate is mounted, and a communicating hole that communicates with the wafer suction hole and that is independent of the frame body suction hole is formed in the mounting surface of the table base.

3. The processing apparatus according to claim 2, wherein the wafer suction hole extends from the bottom surface of the frame body to open in the plate mounting surface of the frame body, and
the suction force transmitted through the wafer suction hole is applied to an undersurface of the porous plate, opposite the suction surface.

4. The processing apparatus according to claim 1, wherein the wafer suction hole is formed so as to open in a side surface of the frame body, and a communicating hole made to communicate with the wafer suction hole is formed in a side surface of the table base.

5. The processing apparatus according to claim 4, wherein the wafer suction hole and the communicating hole are connected by a communicating passage extending between the wafer suction hole and the communicating hole.

6. The processing apparatus according to claim 4, wherein the suction force transmitted through the wafer suction hole is applied to a side surface of the porous plate.

7. The processing apparatus according to claim 1, wherein the fastener is a bolt.

8. The processing apparatus according to claim 1, wherein the fixing hole is formed on an outer circumferential stepped portion formed along an outside side wall of the frame body.

* * * * *